United States Patent
Ret et al.

(10) Patent No.: US 10,855,102 B2
(45) Date of Patent: Dec. 1, 2020

(54) METHOD FOR MONITORING A SOURCE CHANGEOVER SWITCH AND SOURCE CHANGEOVER SWITCH IMPLEMENTING SUCH A METHOD

(71) Applicant: Schneider Electric Industries SAS, Rueil Malmaison (FR)

(72) Inventors: Alain Ret, Montchaboud (FR); Yannick Neyret, Biviers (FR); Jean-Pierre Nereau, Seyssinet (FR); Jean-Marie Hypolite, Meylan (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 324 days.

(21) Appl. No.: 15/834,910

(22) Filed: Dec. 7, 2017

(65) Prior Publication Data

US 2018/0241245 A1 Aug. 23, 2018

(30) Foreign Application Priority Data

Feb. 17, 2017 (FR) ...................... 17 51279

(51) Int. Cl.
*H02J 9/06* (2006.01)
*H02J 9/08* (2006.01)
(Continued)

(52) U.S. Cl.
CPC ............ *H02J 9/06* (2013.01); *G01R 31/3277* (2013.01); *H02J 3/0073* (2020.01); *H02J 9/08* (2013.01)

(58) Field of Classification Search
CPC ... H02J 9/06; H02J 3/0073; H02J 9/08; G01R 31/3277; H01H 9/00
See application file for complete search history.

(56) References Cited

U.S. PATENT DOCUMENTS 5,739,594 A 4/1998 Sheppard et al.
7,432,615 B2 * 10/2008 Hjort ...................... H02J 9/062
307/64
(Continued)

FOREIGN PATENT DOCUMENTS

WO WO 2012/072526 A2 6/2012

OTHER PUBLICATIONS

French Preliminary Search Report dated Oct. 18, 2017 in French application 17 51279 filed on Feb. 17, 2017 (with English Translation of Categories of Cited Documents and Written Opinion).
(Continued)

*Primary Examiner* — Jared Fureman
*Assistant Examiner* — Emmanuel Dominique
(74) *Attorney, Agent, or Firm* — Oblon, McClelland, Maier & Neustadt, L.L.P.

(57) ABSTRACT

A method for monitoring an electric power source changeover switch, including a step of identifying all of the combinations of operating modes and availability states of the power sources, a step of associating a configuration of a state of switches with each combination, a step of watching for a change in configuration. Upon a change in configuration, a step of controlling the switches is executed in order to place the switches in a state complying with the configuration. In the absence of a change in configuration, a step monitors the compliance of the configuration with the actual state of the switches. A method further including monitoring a source changeover switch implemented in a test device, and to a source changeover switch implementing such a method.

16 Claims, 8 Drawing Sheets

(51) Int. Cl.
*H02J 3/00* (2006.01)
*G01R 31/327* (2006.01)

(56) References Cited

U.S. PATENT DOCUMENTS

| | | | |
|---|---|---|---|
| 8,193,662 B1 | 6/2012 | Carlson et al. | |
| 9,225,202 B1 | 12/2015 | Kim et al. | |
| 2003/0034693 A1* | 2/2003 | Wareham | H02J 9/06 307/23 |
| 2004/0124710 A1 | 7/2004 | Pfeiffer | |
| 2005/0168073 A1* | 8/2005 | Hjort | H02J 9/062 307/65 |
| 2007/0018506 A1* | 1/2007 | Paik | H02J 9/06 307/115 |
| 2010/0019574 A1 | 1/2010 | Baldassarre et al. | |
| 2010/0264743 A1* | 10/2010 | Jung | H02J 9/061 307/80 |
| 2013/0257159 A1 | 10/2013 | Wang et al. | |

OTHER PUBLICATIONS

U.S. Appl. No. 15/660,222, filed Jul. 26, 2017, Alain Ret.

\* cited by examiner

Fig.1

Cfg_1

Cfg_2

Cfg_3

Cfg_4

| Md | Md1 | Md1 | Md1 | Md1 | Md2 | Md2 | Md2 | Md2 | Md3 | Md3 | Md3 | Md3 | Md4 | Md4 | Md4 | Md4 |
|---|---|---|---|---|---|---|---|---|---|---|---|---|---|---|---|---|
| Vi10 | 1 | 0 | 0 | 1 | 1 | 0 | 0 | 1 | 1 | 0 | 0 | 1 | 1 | 0 | 1 |
| Vi20 | 0 | 1 | 0 | 1 | 0 | 1 | 0 | 1 | 1 | 0 | 1 | 1 | 0 | 1 | 0 | 1 |
| Vi40 | 1 | 0 | 0 | 1 | 0 | 0 | 0 | 0 | 0 | 0 | 0 | 0 | 1 | 0 | 0 | 1 |
| Vi50 | 0 | 1 | 0 | 0 | 1 | 1 | 1 | 1 | 0 | 0 | 0 | 0 | 0 | 1 | 0 | 1 |
| Configuration | Cfg_2 | Cfg_3 | Cfg_1 | Cfg_2 | Cfg_3 | Cfg_3 | Cfg_3 | Cfg_3 | Cfg_1 | Cfg_1 | Cfg_1 | Cfg_1 | Cfg_2 | Cfg_3 | Cfg_1 | Cfg_4 |

METHOD FOR MONITORING A SOURCE CHANGEOVER SWITCH AND SOURCE CHANGEOVER SWITCH IMPLEMENTING SUCH A METHOD

TECHNICAL FIELD

The invention relates to a method for monitoring a source changeover switch intended to connect electric power sources to electrical loads according to the availability of said power sources. The invention relates also to a source changeover switch including means for implementing such a method.

STATE OF THE ART

The availability of electric power is important, among other things for hospitals, for industries in continuous production or for installations operating with large computing means. In effect, an untimely break in the electric power supply can cause malfunctioning of the equipment supplied. Consequently, to avoid an untimely break in the electrical supply, a device generally called source changeover switch is used: as soon as the main power source is no longer available, the source changeover switch automatically switches the incoming electric power to a second available power source. This second source is generally a generator set but can be a different electrical line or an output of a redundant transformer of the electrical installation. Moreover, it is increasingly commonplace to have several other power sources in order to mitigate any failure of the second source, for example a failure of the generator set to start up or electrical line maintenance operations. The second source supplies the power as long as the main source is unavailable. When the latter becomes available again, as a general rule, the source changeover switch disconnects the second source to automatically reconnect the user to the main source. Depending on the need of the user, other modes of transition to a return to a normal situation may exist.

Since the dependability and the safety of the goods and/or of the people are involved, the operation of the source changeover switch must be reliable and malfunction-free. The complexity of the installation and the risk of malfunction increase exponentially when the installation includes more than two sources and when the power of the electrical installation exceeds several hundreds of amperes: the switches used can be power circuit breakers ensuring the additional function of protection against short circuits. These power circuit breakers have a more complex operation than simple contactors, in particular the operation thereof requires a step of rearming between opening and closing, and they can be plugged in or unplugged for maintenance operations. In case of a problem, it is essential to provide a maximum of information and of assistance to the operator in order to assist in rapidly solving the problem. In effect, a shutdown in operation can cause significant economic or human loss.

The document EP 2 903 129 A1 describes the operation of a source changeover switch intended to manage two sources that can be of power distribution network or backup generator type according to five different operating modes. This device is optimized for two sources but does not easily allow the integration of other power sources.

The document US 2004/169422 describes the operation of a source changeover switch intended to manage three power sources constructed from two source changeover switches operating in cascade fashion, each of the two source changeover switches managing only two sources. This arrangement is well suited for a domestic or small business use given the reasonable cost of each of the source changeover switches but does not correspond to a solution that is economically interesting in an environment where the power involved is significant. Also, the number of operating modes is limited by the cascading principle, the priority of the sources being set by the position of the inputs of the sources on the changeover switches.

The subject of the invention is a method for monitoring a source changeover switch that makes it possible to adapt to a wide variety of electrical installation configurations and of switch types while ensuring great operational safety. In case of an operating fault of the source changeover switch, the monitoring method according to the invention provides diagnostic assistance which makes it possible to reduce the downtime and consequently minimize any possible loss caused by an operational shutdown.

SUMMARY OF THE INVENTION

For that, the invention describes a method for monitoring an electric power source changeover switch, said changeover switch including:
  inputs for receiving availability states of several power sources,
  inputs for receiving possible operating modes of the source changeover switch, and
  outputs for controlling an open or closed state of switches intended to connect the electric power sources to one or more loads,
the method including:
  a step of identifying all of the combinations of possible operating modes and possible availability states of the power sources, and
  an association step consisting in associating a configuration of an open or closed state of each switch with each combination identified in the identification step.

Advantageously, the monitoring method further includes a step:
  of reading an operational operating mode chosen from the possible operating modes, and
  of reading the availability states of the power sources.

Advantageously, the method for monitoring a source changeover switch further includes a step of watching for a change of operational operating mode or for a change of availability state of one or more power sources.

Preferentially, in the case of a change of operational operating mode or of a change of availability state of one or more power sources, the method performs a step of controlling the outputs to place the switches in the configuration associated with the new combination of the operational operating mode and of the state of the power sources.

Advantageously, the source changeover switch further including inputs for receiving actual states of the switches, and, in the absence of change of operational operating mode and in the absence of change of availability state of one or more power sources, the method includes a step of monitoring compliance, intended to monitor the compliance of the configuration of an open or closed state of each switch with the actual state of said switches.

Preferentially, in the case of a noncompliance of the configuration of a state of each switch with the actual state of said switches, then said method includes an additional step of informing and requesting validation by the operator to return to the step of controlling the outputs.

Advantageously, the source changeover switch further including inputs for receiving fault states, the method includes a step of detection of the presence of at least one fault state.

Preferentially, in the case of the presence of at least one fault state, the method includes a step of assisting the operator in diagnosing the fault.

Advantageously, the step of assisting the operator in diagnosing the fault consists in providing the operator with at least the information on the state of the power sources, on the operational operating mode, on the actual state of the switches, and on the fault state or states.

Preferentially, the step of assisting in the diagnosis is executed as long as a fault state is present.

Advantageously, the step of monitoring compliance is executed when all of the fault states have disappeared.

Advantageously, the method for monitoring a source changeover switch is implemented in a test device including:
  connections for receiving signals simulating availability states of the power sources,
  connections for receiving signals simulating states of the switches,
  connections for receiving signals simulating fault states,
  connections for sending signals to outputs simulating a control of the switches intended to connect electric power sources to the load or loads,
  an operator interface intended to display messages and select an operational operating mode from several possible operating modes, and
  a data processing unit including:
    one or more circuits for actuating the operator interface,
    one or more circuits for acquiring the signals simulating the states of the switches,
    one or more circuits for acquiring the signals simulating the availability states of the power sources,
    one or more circuits for acquiring the signals simulating the fault states,
    one or more circuits for executing the steps of the method, and
    one or more circuits for sending signals to activate control outputs.

Preferentially, the method for monitoring a source changeover switch implemented in the test device is such that:
  the signals simulating availability states of the power sources, the signals simulating states of the switches and the signals simulating fault states are supplied by electrical or computing means activated by an operator, and
  the signals to outputs simulating a control of the switches activate a state display device.

Advantageously, the method for monitoring a source changeover switch implemented in the test device is such that the signals simulating the operating mode, the availability states of the power sources, the signals simulating states of the switches and the signals simulating fault states are supplied according to scenarios prestored or generated by means of random functions.

Preferentially, the method for monitoring a source changeover switch implemented in the test device is such that the signals simulating the states and the signals to the outputs are represented graphically on the operator interface.

Another subject of the invention is a source changeover switch for implementing the method described previously, the source changeover switch including:
  inputs for receiving availability states of the power sources,
  inputs for receiving actual states of the switches,
  inputs for receiving fault states,
  outputs for controlling the switches intended to connect electric power sources to the load or loads,
  an operator interface intended to display messages and select an operational operating mode from several possible operating modes, and
  a data processing unit including:
    one or more circuits for actuating the operator interface,
    one or more circuits for acquiring the actual states of the switches,
    one or more circuits for acquiring the availability states of the power sources,
    one or more circuits for acquiring the fault states,
    one or more circuits for executing the steps of the method, and
    one or more circuits for activating the control outputs.

BRIEF DESCRIPTION OF THE DRAWINGS

Other advantages and features will emerge more clearly from the following description, of particular embodiments of the invention, given as nonlimiting examples, and represented in the attached drawings in which.

DETAILED DESCRIPTION OF PREFERRED EMBODIMENTS

In the description, the expression "a source is available" will be used to qualify a source capable of delivering electric power.

The term "switch" will be used preferentially to refer to an electrical circuit breaker but may also refer to a contactor, a switch, one of the ways of a double contactor, a relay or even a semiconductor solid-state electronic switch. An "open" switch is a switch that does not allow power to pass, a "closed" switch allows power to pass.

Figure 1:
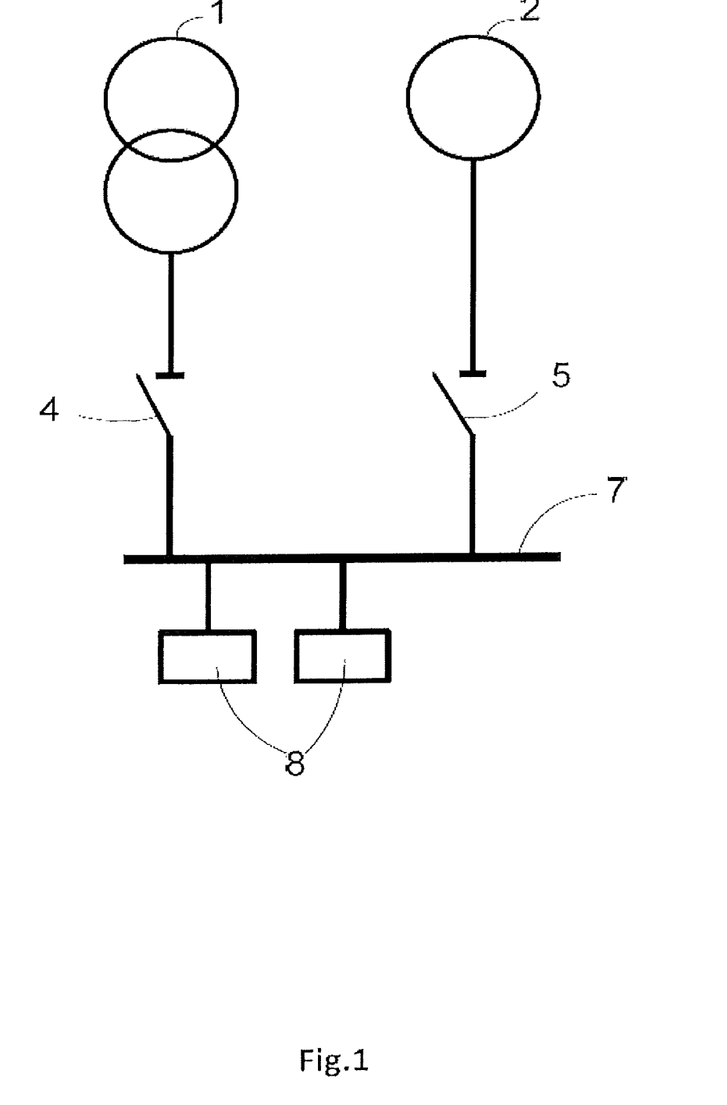
FIG. 1 is a conventional schematic representation of an electrical installation including a source changeover switch.

FIG. 1 is a conventional schematic representation of an electrical installation including a source changeover switch. A source 1, generally a so-called "main" source, supplies electric power to one or more loads 8. A load 8 can be an item of equipment or a set of several items of equipment whose operation must not be interrupted, such as, for example, a technical zone containing items of equipment that have to be permanently supplied or a building whose power supply has a critical aspect. In the rest of the document, the term "load" will be able to cover one or several loads. A switch 4, connected upstream to the source 1 and downstream to a busbar 7, establishes an electrical link between the source 1 and the busbar 7. The load 8 is connected to the busbar 7.

In case of unavailability of the main source 1, for example following an opening of the circuit upstream of the installation, the function of the source changeover switch is to control the switch 5, connected, upstream, to a second electric power source 2 and, downstream, to the busbar 7, in order to electrically link the second source 2 with the load 8 and thus make it possible to continue to power the load 8. The second source 2 is generally a backup source and will be able to be a local generator such as a generator set. For safety, the switch 4 will be open. When the main source 1 is once again available, the source changeover switch controls the closing of the switch 4 and the opening of the switch 5 in order to revert to the original situation.

Figure 2:
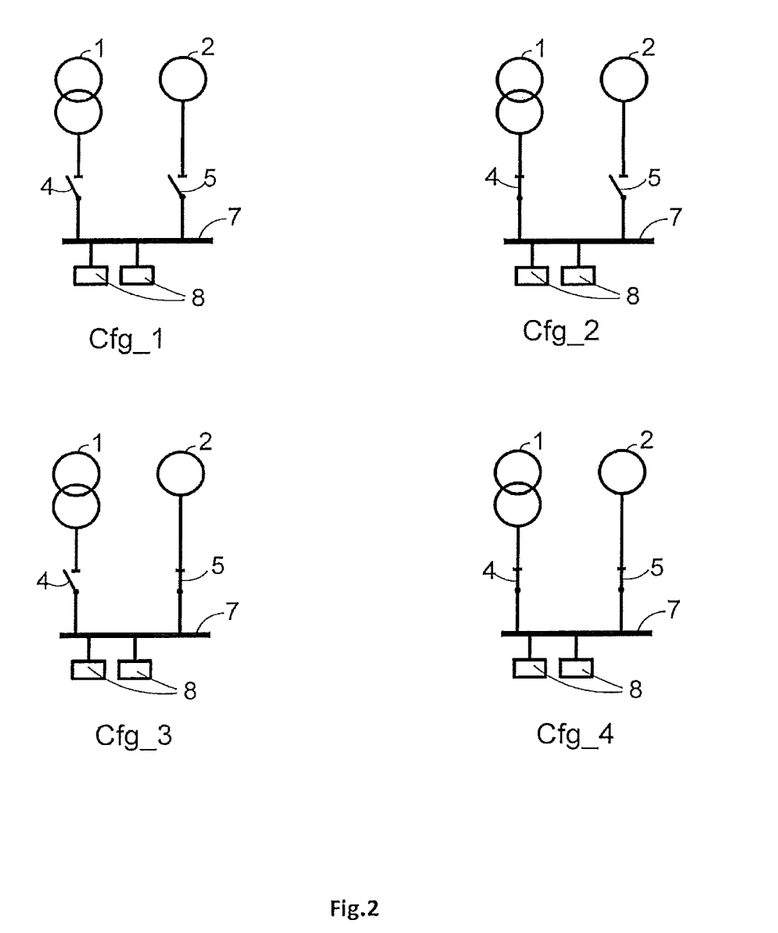
FIG. 2 is a schematic representation of the possible configurations of open or closed states of switches controlled by a source changeover switch operating with two power sources.

FIG. 2 is a schematic representation of the possible configurations of open or closed states of the switches 4 and 5 in the case of a source changeover switch operating with two power sources 1 and 2. Each of the switches 4, 5 can take two positions: a closed position or an open position. There are therefore four possible combinations:

- a first configuration called Cfg_1 in which the two switches 4 and 5 are open, that is to say not conducting. The load 8 is not supplied,
- a second configuration called Cfg_2 in which the switch 4 is closed, that is to say conducting, and the switch 5 is open. The load 8 is supplied by the main source 1,
- a third configuration called Cfg_3 in which the switch 4 is open and the switch 5 is closed. The load 8 is supplied by the second source 2, and
- a fourth configuration called Cfg_4 in which the two switches 4, 5 are closed. The load 8 is supplied by the two sources 1 and 2. Said sources must be in phase for permanent operation, otherwise this configuration Cfg_4 must be prohibited.

The main function of the source changeover switch is to automatically manage the closing and the opening of the switches 4, 5 according to the availability of the sources 1, 2 in order for the load to be supplied despite any availability problems of the sources 1, 2. The configurations Cfg_2 and Cfg_3 meet this need. However, an operator may decide to perform an intervention on the load 8 and order a shutdown of supply to the load 8. The configuration Cfg_1 meets this need. Finally, the configuration Cfg_4 can be used to supply a maximum of power to the load 8. The function of the source changeover switch is therefore to control the switches 4 and 5 according to the requests from the operator and according to the availability of the sources 1 and 2. The source changeover switch is therefore a system acting according to information from its environment.

Figure 3:
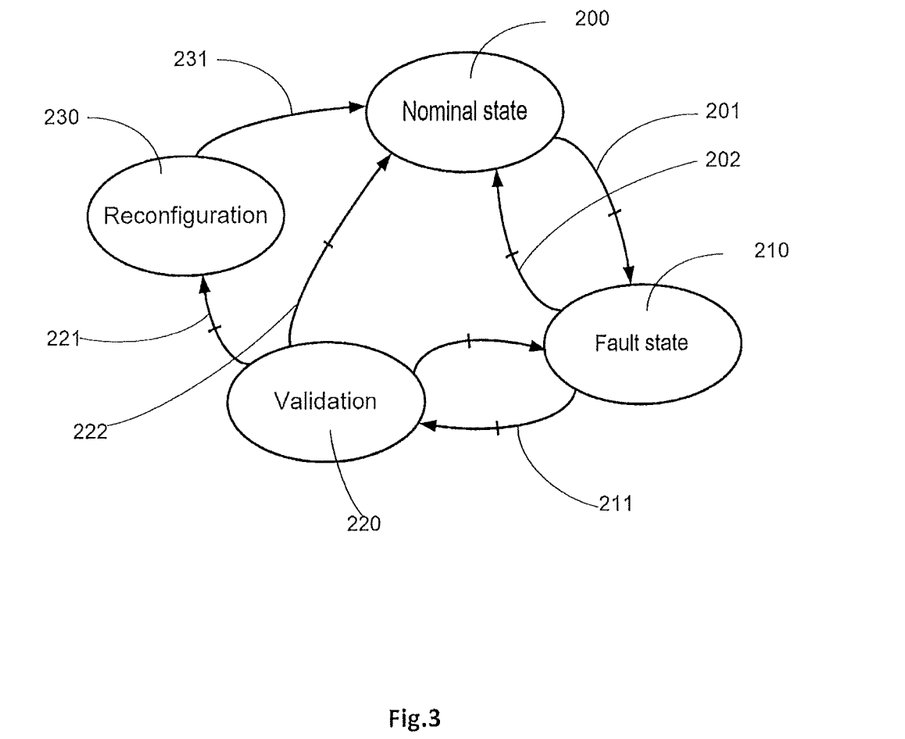
FIG. 3 is a state diagram representing different operating states of a source changeover switch and the conditions for transition from a given operating state to another state.

The method for monitoring the source changeover switch is represented in FIG. 3 in the form of a state diagram. The source changeover switch can be in a nominal state 200. In this mode, the current configuration corresponds to an expected configuration, said expected configuration being a function of an operating mode chosen by the operator and of the availability of the sources. When there is a deviation between the current configuration and the expected configuration, the system switches to a fault state 210 through a transition 201. The deviation may be justified, for example by a failure in the switchgear or by an alarm from one of the items of equipment, for example an overheating of the source 2, or even by an overcurrent having caused the opening of one of the switches. In this case, an intervention of the operator is necessary to repair the fault. When the fault is eliminated, if the current configuration corresponds to the expected configuration, the system returns automatically, that is to say without additional intervention from the operator, to the nominal operating state 200 through a transition 202. When the deviation is linked to a change of configuration from an origin external to the source changeover switch, for example the manual opening of a switch by the operator, the system switches through a transition 211 to a waiting mode 220 by displaying a message to the operator to prompt him or her to validate a return to the nominal operating state, that is to say a return to a configuration of the system compliant with the expected configuration by passing through a transition 221. The message will for example be "Press OK to resume". This operating mode allows the operator to validate the end of his or her intervention, in the case where, for example, said operator has manually opened a switch. The source changeover switch will then proceed with a reconfiguration 230, which corresponds, in this example, to the closing of the switch opened previously by the operator, and a return to the nominal operating state 200 through a transition 231. When a reconfiguration is not necessary because the current configuration corresponds to the expected configuration, after the validation step 220 the system returns to the nominal operating state 200 through the transition 222.

The monitoring method of the invention is constructed on the basis of the diagram represented in FIG. 3. It is applicable regardless of the number of sources, the number of switches or even regardless of the wiring between the sources and the switches. When it is in nominal operating state 200, the source changeover switch can operate according to various modes:

- a first mode Md1, called "automatic mode", in which the source changeover switch switches over automatically to the configuration Cfg_3 when the source 1 is no longer available and switches over automatically to the configuration Cfg_2 when the source 1 is once again available,
- a second mode Md2, called "forced backup mode", in which the source changeover switch switches over to the configuration Cfg_3 and remains in this configuration independently of the availability of the sources 1 and 2. This mode can be used for example to shed load from the source 1,
- a third mode Md3, called "maintenance mode", in which the source changeover switch switches over to the configuration Cfg_1 and remains in this configuration independently of the availability of the sources 1 and 2. This mode can be used for example to perform maintenance operations on the load 8, and
- a fourth mode Md4, called "coupling mode", in which the source changeover switch switches over to the configuration Cfg_4, that is to say with the load 8 connected simultaneously to the sources 1 and 2.

Other operating modes can be envisaged according to the need of the operator or of the configuration of the electrical installation. The user chooses from these different modes and according to his or her need, a mode which will be hereinafter called "operational operating mode".

Figure 4:
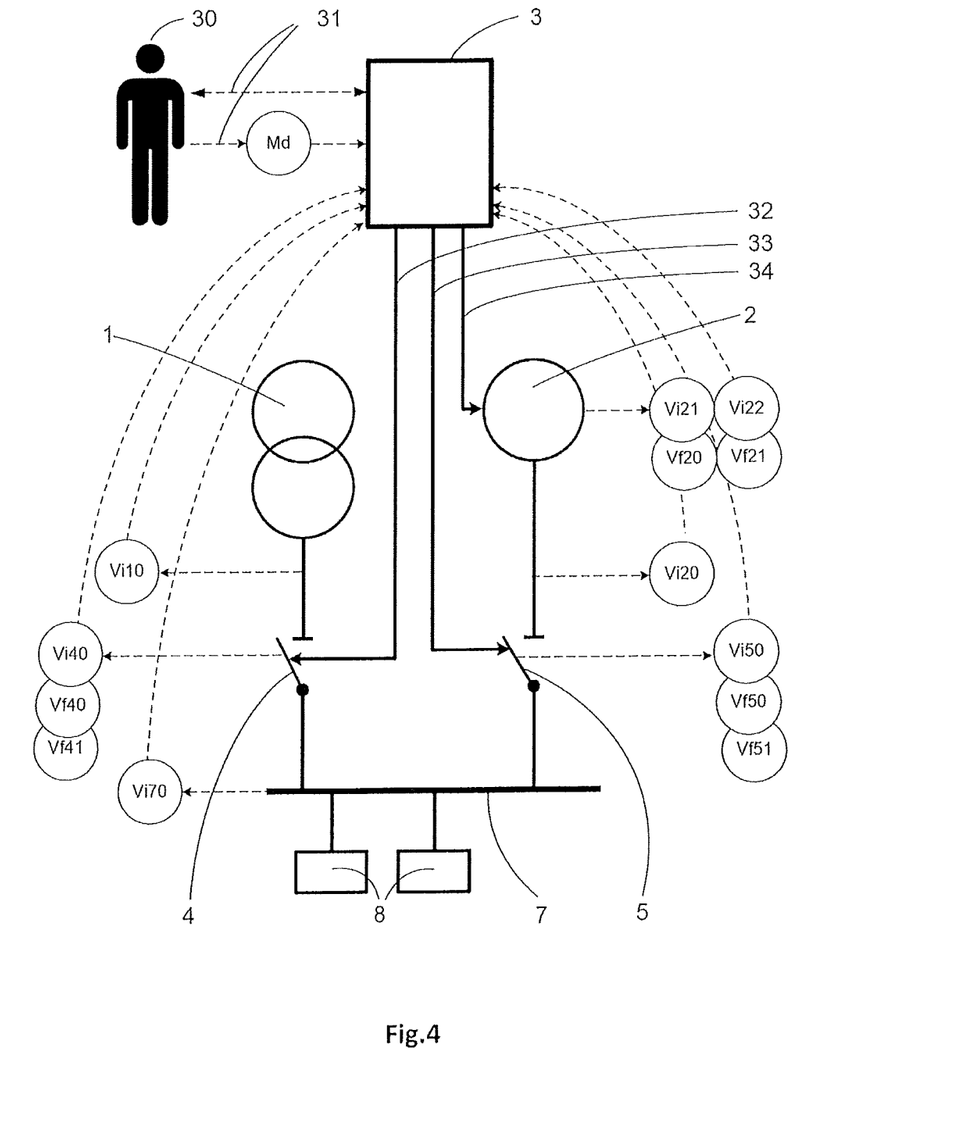
FIG. 4 is a block diagram of a source changeover switch showing an interface to an operator for receiving information or choosing an operating mode, inputs for information from state sensors and inputs-outputs to switches intended to connect electric power sources to loads according to the method of the invention.

To manage the closing and the opening of the switches 4, 5 according to the availability of the sources 1 and 2, the source changeover switch 3 needs to receive information on the availability of the sources 1 and 2, on the open or closed state of the switches 4 and 5 and on the operational operating mode desired by the operator. FIG. 4 represents a block diagram of the source changeover switch showing:

an interface 31 to the operator 30,
inputs for state Vi or fault Vf information, and
outputs 32, 33 to switches 4 and 5.

The operator 30 is informed of the operation of the source changeover switch by a local and/or remote interface 31. This interface includes, for example, a screen for displaying messages, lamps and a keyboard or buttons making it possible to input data or validate an operation or even select an operational operating mode Md from several possible operating modes Md1 to Md4. The source changeover switch 3 receives information on the availability of the sources: Vi10 is an input variable giving the availability state of the source 1. Vi10 can be a binary datum, for example Vi10=0 when the main source 1 is not available and Vi10=1 when the main source 1 is available. Vi10 can also be a numeric datum, for example a source 1 voltage value (Vi10=380 Volt) or even a datum in text format, for example Vi10="present" or Vi10="absent". Likewise, the variable Vi20 informs the source changeover switch 3 of the availability state of the source 2, the variable Vi70 informs the source changeover switch 3 of the presence of voltage on the busbar 7. Other variables may be useful to the operation of the source changeover switch. For example, a variable Vi21 can represent the level of fuel intended for a heat engine coupled to an electric power generator forming the second source 2. In this case, a variable Vi22 can represent the speed of rotation of said electric power generator.

The source changeover switch 3 receives information on the actual state of the switches 4 and 5. Vi40 is the actual state of the switch 4. Vi40 can be a binary datum, for example Vi40=0 when the switch 4 is open and Vi40=1 when the switch 4 is closed. Vi40 can also be a datum in text format, for example Vi40="open" or Vi40="closed". Likewise, Vi50 informs the source changeover switch 3 on the actual state of the switch 5. The set of these variables will hereinafter be called "input variables". The source changeover switch 3 has outputs for controlling the switching over of the switches 4 and 5. An output 32 makes it possible to activate the opening or the closing of the switch 4. An output 33 makes it possible to activate the opening or the closing of the switch 5. The outputs 32 and 33 thus make it possible to change the configuration of the switches. In some types of source changeover switch, an output 34 controls a starting or a stopping of a heat engine intended to drive an electric power generator forming the second source 2.

Additional variables are used by the source changeover switch to inform the operator of any operating fault. These variables, hereinafter called "fault variables", are, for example, Vf40 to indicate that the switch 4 has opened automatically because of an overcurrent, Vf41 to indicate a switch 4 in disconnected position. Likewise, Vf50 indicates that the switch 5 has opened automatically because of an overcurrent, Vf51 indicates a switch 5 in disconnected position. The variable Vf20, for example, indicates the state of the heat engine startup battery, the variable Vf21 indicates the temperature of the electric power generator forming the second source 2.

Figure 5:
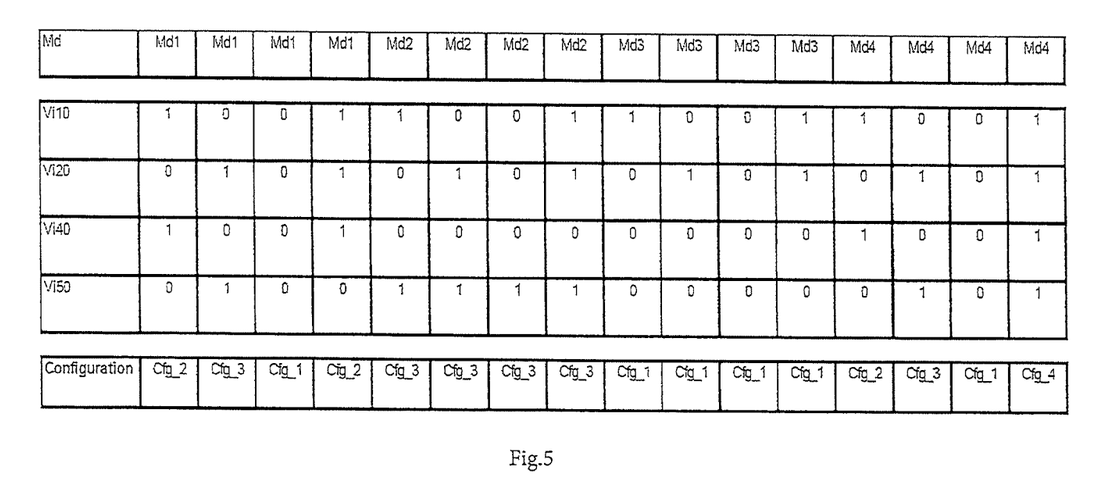
FIG. 5 is a table identifying of all of the possible combinations for four operating modes requested by the operator and two possible availability states of two power sources with a configuration of a state of the switches corresponding to each combination.
Figure 6:
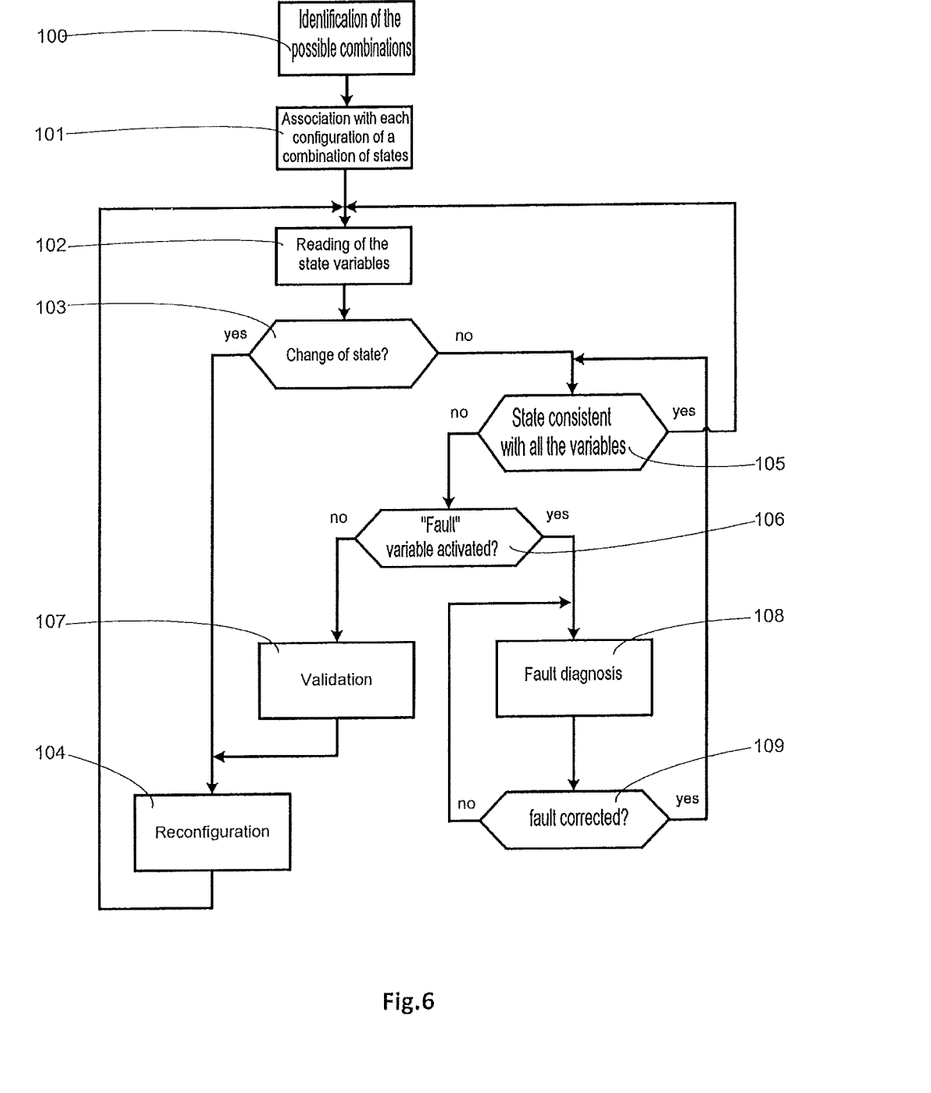
FIG. 6 is a flow diagram illustrating the operation of a method for monitoring a source changeover switch according to the invention.

FIG. 6 is a flow diagram illustrating the operation of a method for monitoring a source changeover switch according to the invention. A first step 100 of the method for monitoring the source changeover switch consists in identifying all of the possible combinations of the operating modes and of the availability states of the power sources. For example, for four modes Md1 to Md4 and two sources that can be either available or unavailable, there are sixteen possible different combinations (four modes multiplied by two sources multiplied by two possible states of each of the sources). The number of combinations depends only on the number of power sources and on the number of operating modes. These combinations are combined in a table in FIG. 5.

A second step 101 of the method consists in associating a single configuration of an open or closed state of each switch with each combination identified in the step 100. As an example, the table in FIG. 5 indicates all of the possible combinations in the case of four operating modes (Md1 being an "automatic mode", Md2 being a "forced backup mode", Md3 being a "maintenance mode", Md4 being a "coupling mode") and for each possible state of the sources (Vi10 and Vi20 respectively giving the availability state of the sources 1 and 2 in binary form). Thus, in "automatic mode" Md1, when the source 1 is present (Vi10=1) and when the source 2 is absent (Vi20=0), the configuration Cfg_2 must be realized, which corresponds to the switch 4 in a closed state and the switch 5 in open state. If the source 1 becomes unavailable (Vi10=0) and the source 2 is also unavailable (Vi20=0), the changeover switch must be in the configuration Cfg_1, which corresponds to the switch 4 and the switch 5 in open state. The construction of the table is performed at the time of the design of the electrical installation then the table is preferably loaded into a memory 42 in the source changeover switch in order for the latter to be able to actuate the switches 4 and 5 according to the desired configuration. The association of each combination identified in the step 100 with a single configuration of the switches can be performed by means of a table as in the preceding example or by means of an equation or any other computation or modelling means.

As indicated in FIG. 6, during a step 102, all of the input variables are scanned. This scan consists in reading an operational operating mode Md chosen by the operator out of the possible operating modes Md1 to Md4, this choice being made by means of the operator interface 31, and reading the availability states Vi10, Vi20 of the power sources 1, 2. During a step 103, any change of operational operating mode Md or change of availability of one or more sources 1, 2 is detected. As soon as a change is detected, the step 104 places the switches 4 and 5 in the configuration associated with the new combination of the operational operating mode Md and of the state of the power sources, in accordance with the table of FIG. 5, then there is a return to the step 102.

If there is no change of configuration during the step 103, a step 105 monitors the compliance of all of the input variables in relation to the current configuration. If all of the input variables comply with the configuration, there is a return to the step 102. The step 105 is therefore executed cyclically, as long as all of the input variables comply with the configuration. If at least one input variable does not comply with the configuration, a test step 106 detects whether a fault variable is activated. In this case, in the step 108, an identification of the fault variable activated is communicated to the operator by means of the interface 31, accompanied by any other useful information in order for the operator to be able to rapidly diagnose the problem causing the activation of the fault variable. In addition, the use of a diagnostic database created by experts can be installed in the changeover switch to guide the operator in his or her procedure. A step 109 checks that the operator has corrected the fault by searching for any active fault variable. If there is still a fault variable active, there is a return to the step 108 with possible updating of the information intended for the operator. When there is no fault variable still active in the step 109, there is a return to the step 105 to check the compliance of all of the input variables in relation to the current configuration. If at least one input variable does not comply with the configuration in the step 105 but there is no fault variable active, there is a transition to the step 107 corresponding to a validation on the part of the operator. In this step, a message indicating a noncompliance will be displayed by means of the interface 31 then a prompt to revert to a normal situation will be sent by means of a message such as, for example, "press OK to resume". After validation by the operator in the step 107, there is a return to the step 104 to reconfigure the switches in order to place them in a state complying with the desired configuration.

To illustrate this phase of the method, it may be that, for example, in the step 105, the input variable Vi50 giving information on the state of the switch 5 does not comply with the state requested by the configuration following an intervention of the operator having manually controlled the switch 5. In the absence of any active fault variable tested in the step 106, there is a transition to the step 107. A signalling of the noncompliance of the variable Vi50 is sent to the operator by means of the interface 31 and a prompt to validate a return to compliance is offered to him or her. After validation by the operator, there is a transition to the step 104 of reconfiguration of the switches. In this example, a control of the switch 5 will be performed to return it to the state requested by the configuration.

The method of the invention thus makes it possible to monitor a source changeover switch by limiting the risks of incorrect operation of the changeover switch. In effect, all of the possible combinations of operating modes and availability states of the power sources are taken into account and a single combination of states of the switches is associated with each combination. There cannot therefore be any indeterminate state. In case of failure of a component or after a manual operation, the method makes it possible to return to nominal operation by providing necessary information then by executing the necessary actions on the switches after validation by the operator. This operating mode is particularly advantageous because it avoids an automatic activation of the switches to restore them to the expected state while the operator is currently intervening on the electrical installation. Also, the operator intervenes primarily via the interface 31 which avoids direct intervention on the switchgear and a risk of error in operating the switchgear. Since the information is centralized to the operator, he or she has all of the data necessary to quickly make the right decisions. A rapid restart after an electric power supply shutdown makes it possible, for example, to limit the economic loss linked to a production shutdown.

Figure 7:
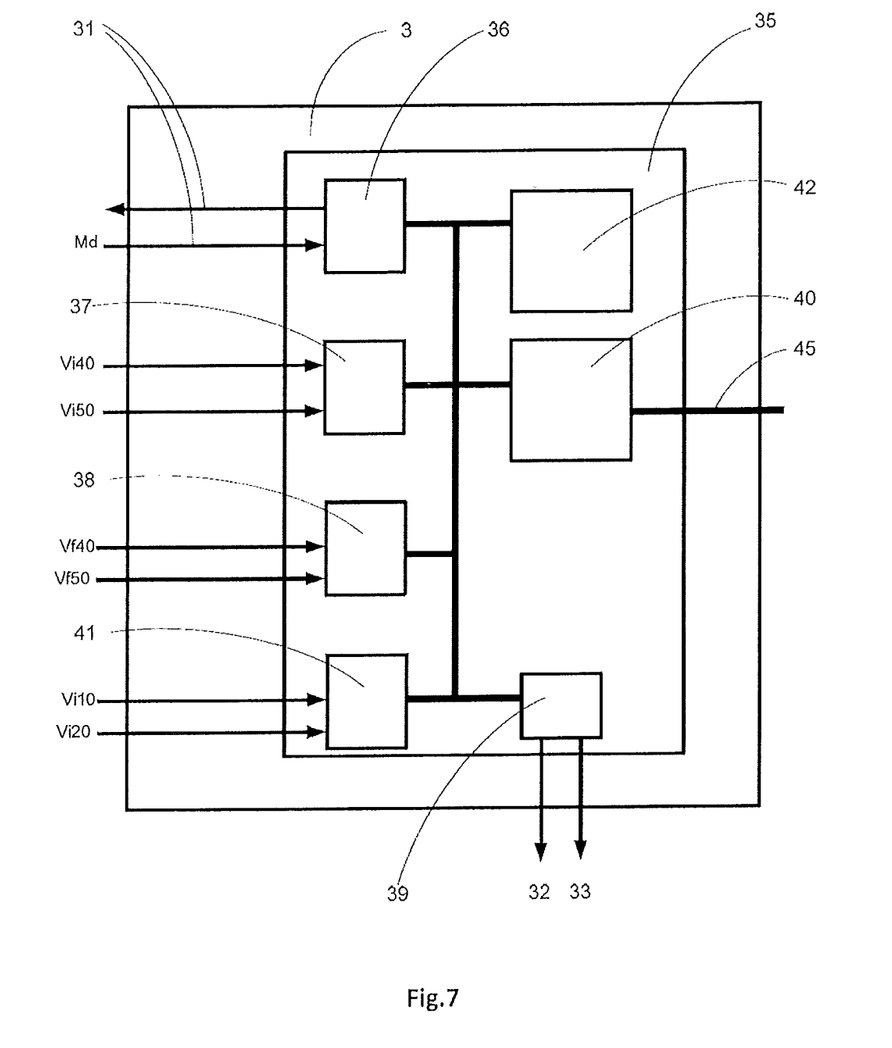
FIG. 7 is a schematic representation of a source changeover switch allowing the implementation of the monitoring method according to the invention.

The method of the invention is preferentially intended to be implemented in a source changeover switch 3. FIG. 7 is a schematic representation of such a source changeover switch. The source changeover switch is composed of one or more housings including:

inputs for receiving availability states Vi10, Vi20 of the power sources, inputs for receiving actual states Vi40, Vi50 of the switches 4, 5, inputs for receiving fault states Vf, outputs 32, 33 for controlling the switches 4, 5 intended to connect electric power sources 1, 2 to loads 8, an operator interface 31 intended to display messages, diagnostic information and select an operational operating mode Md from several possible operating modes Md1 to Md4, and a data processing unit 35 including one or more circuits 36 for actuating the operator interface 31, one or more circuits 37 for acquiring the actual state inputs Vi40, Vi50 of the switches 4 and 5, one or more circuits 38 for acquiring the fault states Vf, one or more circuits 41 for acquiring the availability states Vi10, Vi20 of the power sources, one or more circuits 39 for activating the control outputs 32, 33 and one or more circuits 40 for executing the steps of the method.

The circuit or circuits 40 is/are preferentially one or more microprocessors. One or more memories 42 are used to store the steps of the method, the data represented in the table in FIG. 5 and the data useful to the diagnostic process and to the execution of the method. The data are transferred into the memory or memories 42 directly or via the circuit 40, as represented in FIG. 7, by any data transmission means 45 known from the art, for example a connection to a communication network, a USB port, a WiFi or NFC wireless connection according to a suitable communication protocol. The possibility of updating the data represented in the table in FIG. 5 or the diagnostic data is particularly useful in an industrial environment. In effect, since the electrical installation is regularly adapted to the changing business, a modification of the operating mode or of the number of power sources does not require any great programming efforts or any lengthy validation of the modifications.

Figure 8:
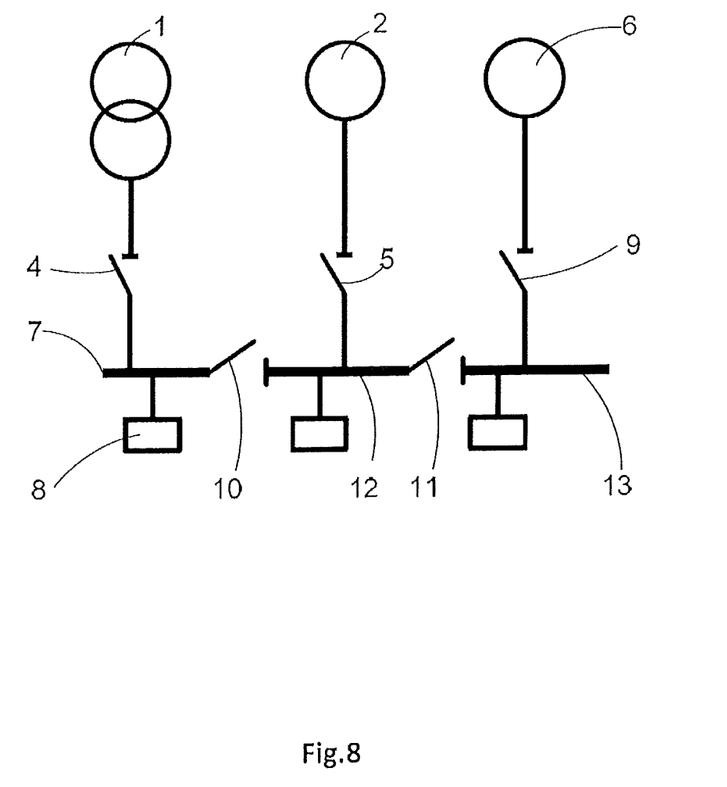
FIG. 8 is a schematic representation of an electrical installation including more than two electric power sources and more than two switches.

The present invention is in no way limited to the embodiments described. For example, the method can be applied to an electrical installation including more than two sources 1, 2, 6 and more than two switches 4, 5, 9, 10, 11 such as represented in FIG. 8. In particular, the device can be applied to an electrical installation including switches 10, 11 whose function is to couple busbars 7, 12, 13. The number of possible combinations can still be counted: in the example illustrated in FIG. 8, the source changeover switch can operate, for example, according to four operating modes: an "automatic mode" Md5, a "backup mode" Md6 during which the generator 2 is available on its own and powers only a part of the busbar 12, the switch 5 being closed, a "maintenance mode" Md7 in which all of the switches are open, a "shed load mode" Md8 for which the sources 2 and 6 are available, the switches 5, 9, 10, 11 are closed, the switch 4 is open. During the step 100, knowing that there are three sources 1, 2 and 6, each source being able to be available or unavailable, the number of possible combinations is evaluated at twenty-four (four modes multiplied by three sources multiplied by two possible states). During the step 101, a configuration of a state of the switches 4, 5, 9, 10 and 11 will be associated with each of the twenty-four combinations. In theory, $2^5$ or 32 combinations are possible, corresponding to as many different states of the switches 4, 5, 9, 10 and 11. There are therefore, in the example illustrated in FIG. 8, eight combinations not compliant with all of the variables (thirty-two minus twenty-four). In the case where, for example to perform an intervention, the operator 30 places the source changeover switch in "maintenance mode" Md7 then closes the switch 11 to test the coupling of the busbars 12 and 13, the step 105 detects the noncompliance of the state of the switches in relation to the mode Md7 variable and, in the absence of active fault variable, the step 107 will display information signalling the noncompliance of the state of the switch 11 then request a validation from the operator. In the step 104, the switch 11 is reset to open position to be in compliance with the configuration corresponding to the "maintenance mode" Md7.

The method of the invention is thus suited to any electrical installation configuration and makes it possible to guarantee a correct operation of the source changeover switch even when the switches are in a configuration not identified in the step 100. The method for monitoring an electric power source changeover switch of the invention is also intended to be installed in a test or simulation device in order to simulate the operation of a source changeover switch. The test device preferably takes the form of a computer-type calculator or programmable logic controller. Such a test device is used by students in their learning or in the context of professional training of users, beginners or experienced professionals. The test device includes:
 connections for receiving signals simulating availability states (Vi20, Vi30) of the power sources (1, 2),
 connections for receiving signals simulating states (Vi40, Vi50) of the switches (4, 5),
 connections for receiving signals simulating fault states (Vf),
 connections for sending signals to outputs (32, 33) simulating a control of the switches (4, 5) intended to connect electric power sources to the load or loads (8),
 an operator interface (31) intended to display messages and select an operational operating mode (Md) from several possible operating modes (Md1 to Md4), and
 a data processing unit (35) including:
  one or more circuits (36) for actuating the operator interface (31),
  one or more circuits (37) for acquiring the signals simulating the states (Vi40, Vi50) of the switches (4, 5),
  one or more circuits (41) for acquiring the signals simulating the availability states (Vi20, Vi30) of the power sources,
  one or more circuits (38) for acquiring the signals simulating the fault states (Vf),
  one or more circuits (40) for executing the steps of the method, and
  one or more circuits (39) for sending signals to activate control outputs (32, 33).

The signals simulating availability states (Vi20, Vi30) of the power sources (1, 2), the signals simulating states (Vi40, Vi50) of the switches (4, 5) and the signals simulating fault states (Vf) are supplied by electrical means such as changeover switches, switches such as miniature switches or any other device capable of supplying low level signals or even by digital signals driven by an external logic controller or computer. The signals to outputs (32, 33) simulating a control of the switches (4, 5) preferably activate a state display device, for example a panel including lamps or even a screen of computer type. All of the input data, output data, the operating modes are, preferably, represented graphically on an operator interface, such as a computer screen or an image projection on a wall screen.

A memory of the computer forms part of the circuit or circuits for executing the steps of the method (40). This memory contains a list of all of the steps 100 to 109 of the method as well as all of the conditions for transition from one step to the next. A computer program, run by a computation unit forming part of the circuit or circuits (40), executes the method of the invention. The state of the input variables Vi10 to Vi70 and of the fault variables Vf20 to Vf51 are simulated by means of scenarios prestored in memory or generated randomly. For example, to meet the learning need of a beginner user, only scenarios corresponding to the change of availability of the sources are installed. To meet the learning need of an experienced user, scenarios involving changes of availability of the sources and the occurrence of faults are installed. The introduction into a scenario of random fault occurrence or disappearance or of source availability makes it possible to test the user's capacity to react to an unforeseen event. An interface to the user, for example a screen and a keyboard linked to the computer, allows for data input in particular for the identification of the possible combinations of the operating modes Md and of the states of the power sources according to the step 100 then, for the step 101, of associating a configuration of a state of the switches for each combination. Next, the test device executes the method of the invention by using the state of the input and fault variables that are the object of scenarios and the chosen operating mode. The execution of the different steps of the monitoring method is displayed on the screen together with the state of the links 32, 33 and 34. Depending on the level of skill of the user, more or less data may be represented or displayed on the screen, messages may be displayed to guide or correct the operations of the user. The test device can be installed in a transportable case, a demonstration cabinet or any device for teaching use.

A simulator is of great interest in training the user the latter can familiarize him or herself with the use of the source changeover switch with an assurance of not causing damage if an error is made. Also, it is possible to perform the simulation of a complex installation, like that represented in FIG. 8, well before said installation is in operation. An unwanted behaviour can be detected and a correction made before the start of use. Such a simulator will have the following advantages:
 a validation of the operating specifications of the source changeover switch in which the method will be implemented will be able to be implemented,
 the risk of malfunction will be reduced since a simulator makes it possible to test all of the possible cases, including improbable or dangerous cases to be realized in a real electrical installation, and
 the user will be more confident in manipulating the source changeover switch because he or she will have a very good control in the phase of use and will be able to react more rapidly and more effectively. The downtime and the production shutdown costs will be minimized.

The invention claimed is:

1. A method for monitoring an electric power source changeover switch, said changeover switch comprising:
 Inputs to receive availability states of a plurality of power sources,
 inputs to receive possible operating modes of the source changeover switch, and outputs to control an open or closed state of switches in the form of electrical circuit breakers respectively configured to connect the electric power sources to one or more loads,
 the method comprising:
 a step of identifying all combinations of possible operating modes and possible availability states of the power sources,
 an association step comprising associating a configuration of an open or closed state of each said switch with each combination identified in the identification step, a step of setting a control operation to determine whether a deviation between (i) an expected configuration as a function of a current selected operating mode and current availability of the power sources and (ii) a current configuration is linked to a change in configuration from an origin external to the source changeover switch, and a step of setting a second control operation to rectify the deviation between the expected configuration and the current configuration according to a first methodology when the deviation is from the origin external to the source changeover switch and according to a second methodology when the deviation is not from the origin external to the source changeover switch.

2. The method for monitoring a source changeover switch according to claim 1, further comprising:

reading an operational operating mode chosen from the possible operating modes, and reading the availability states of the power sources.

3. The method for monitoring a source changeover switch according to claim 2, further comprising a step of watching for a change of operational operating mode or for a change of availability state of one or more power sources.

4. The method for monitoring a source changeover switch according to claim 3, wherein, in the case of a change of operational operating mode or of a change of availability state of one or more power sources, the method performs a step of controlling the outputs to place the switches in the configuration associated with the new combination of the operational operating mode and of the state of the power sources.

5. The method for monitoring a source changeover switch according to claim 4, wherein said source changeover switch further comprises inputs to receive actual states of the switches, and wherein, in the absence of change of operational operating mode and in the absence of change of availability state of one or more power sources, said method includes a step of monitoring compliance, intended to monitor the compliance of the configuration of an open or closed state of each switch with the actual state of said switches.

6. The method for monitoring a source changeover switch according to claim 5, wherein, in the case of a noncompliance of the configuration of a state of each switch with the actual state of said switches, then said method includes an additional step of informing and requesting validation by an operator to return to the step of controlling the outputs.

7. The method for monitoring a source changeover switch according to claim 1, wherein said changeover switch further includes inputs to receive fault states, said method further comprising a step of detection of presence of at least one fault state.

8. The method for monitoring a source changeover switch according to claim 7, wherein, in the case of the presence of at least one fault state, said method further comprises a step of assisting an operator in diagnosing the fault.

9. The method for monitoring a source changeover switch according to claim 8, wherein the step of assisting the operator in diagnosing the fault comprises providing the operator with at least the information on the state of the power sources, on the operational operating mode, on the actual state of the switches, and on the fault state or states.

10. The method for monitoring a source changeover switch according to claim 9, wherein the step of assisting in the diagnosis is executed as long as a fault state is present.

11. The method for monitoring a source changeover switch according to claim 10, wherein a step of monitoring compliance is executed when all of the fault states have disappeared.

12. The method for monitoring a source changeover switch according to claim 1, wherein said method is implemented in a test device comprising:

connections to receive signals simulating availability states of the power sources, connections to receive signals simulating states of the switches, connections to receive signals simulating fault states, connections to send signals to outputs simulating a control of the switches intended to connect electric power sources to the load or loads, an operator interface to display messages and select an operational operating mode from several possible operating modes, and a data processing unit comprising:

one or more circuits to actuate the operator interface, one or more circuits to acquire the signals simulating the states of the switches, one or more circuits to acquire the signals simulating the availability states of the power sources, one or more circuits to acquire the signals simulating the fault states, one or more circuits to execute the steps of the method, and one or more circuits to send signals to activate control outputs.

13. The method for monitoring a source changeover switch according to claim 12, wherein:

the signals simulating availability states of the power sources, the signals simulating states of the switches, and the signals simulating fault states are supplied by electrical or computing means activated by an operator, and the signals to outputs simulating a control of the switches activate a state display device.

14. The method for monitoring a source changeover switch according to claim 13, wherein signals simulating the operating mode, the signals simulating availability states of the power sources, the signals simulating states of the switches, and the signals simulating fault states are supplied according to scenarios prestored or generated with random functions.

15. The method for monitoring a source changeover switch according to claim 14, wherein the signals simulating the states and the signals to the outputs are represented graphically on the operator interface.

16. A source changeover switch for implementing the method according to claim 1, wherein said changeover switch comprises:

inputs to receive availability states of the power sources, inputs to receive actual states of the switches, inputs to receive fault states, outputs to control the switches intended to connect electric power sources to the load or loads, an operator interface to display messages and select an operational operating mode from several possible operating modes, and a data processing unit comprising:

one or more circuits to actuate the operator interface, one or more circuits to acquire the actual states of the switches, one or more circuits to acquire the availability states of the power sources, one or more circuits to acquire the fault states,
one or more circuits to execute the steps of the method, and
one or more circuits to activate the control outputs.

* * * * *